(12) United States Patent
Gan

(10) Patent No.: US 10,615,194 B2
(45) Date of Patent: Apr. 7, 2020

(54) ARRAY SUBSTRATES, MANUFACTURING METHODS THEREOF, AND LIQUID CRYSTAL DISPLAY (LCD) PANELS

(71) Applicant: Shenzhen China Star Optoelectronics Semiconductor Display Technology Co., Ltd., Shenzhen, Guangdong (CN)

(72) Inventor: Qiming Gan, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 135 days.

(21) Appl. No.: 15/739,710

(22) PCT Filed: Jul. 18, 2017

(86) PCT No.: PCT/CN2017/093251
§ 371 (c)(1),
(2) Date: Dec. 23, 2017

(87) PCT Pub. No.: WO2018/223494
PCT Pub. Date: Dec. 13, 2018

(65) Prior Publication Data
US 2018/0350849 A1  Dec. 6, 2018

(30) Foreign Application Priority Data

Jun. 5, 2017 (CN) .......................... 2017 1 0413393

(51) Int. Cl.
*G02F 1/1368* (2006.01)
*H01L 27/12* (2006.01)
(Continued)

(52) U.S. Cl.
CPC ........ *H01L 27/1288* (2013.01); *G02F 1/1362* (2013.01); *G02F 1/1368* (2013.01);
(Continued)

(58) Field of Classification Search
CPC ................................................ G02F 1/134363
See application file for complete search history.

(56) References Cited

U.S. PATENT DOCUMENTS 7,294,579 B1 * 11/2007 Chi .................. H01L 21/76804
257/E21.578
8,362,526 B2   1/2013 Yang
(Continued)

FOREIGN PATENT DOCUMENTS

CN      101000896 A     7/2007
CN      101604695 A    12/2009
(Continued)

*Primary Examiner* — Sang V Nguyen
(74) *Attorney, Agent, or Firm* — Anrew C. Cheng

(57) ABSTRACT

The present disclosure relates to an array substrate, a manufacturing method thereof and a liquid crystal display (LCD). The manufacturing method of array substrates includes forming a first metal layer on a substrate, etching the first metal layer via a first mask to form a gate and a common electrode, forming a gate insulation layer, an active layer, and a second metal layer on the first metal layer in sequence, etching the second metal layer and the active layer via a second mask to form a source, a drain, and a pixel electrode. As such, the manufacturing process of the array substrate may only require two masks, the productivity may be improved, and the costs may be reduced.

6 Claims, 7 Drawing Sheets

(51) Int. Cl.
    *G02F 1/1362*     (2006.01)
    *G02F 1/1343*     (2006.01)

(52) U.S. Cl.
    CPC .... *G02F 1/13439* (2013.01); *G02F 1/134363* (2013.01); *G02F 1/136286* (2013.01); *H01L 27/124* (2013.01); *G02F 2001/136231* (2013.01); *G02F 2001/136295* (2013.01); *G02F 2201/121* (2013.01); *G02F 2201/123* (2013.01)

(56) References Cited

U.S. PATENT DOCUMENTS

| | | | | |
|---|---|---|---|---|
| 2007/0264735 | A1* | 11/2007 | Byun | H01L 27/1288 438/30 |
| 2008/0023705 | A1* | 1/2008 | Yoon | H01L 29/42384 257/72 |
| 2009/0152562 | A1* | 6/2009 | Yang | G02F 1/13454 257/72 |
| 2011/0309339 | A1* | 12/2011 | You | H01L 27/3248 257/40 |
| 2012/0307171 | A1* | 12/2012 | Hui | G02F 1/133555 349/43 |
| 2016/0035573 | A1* | 2/2016 | Zhang | H01L 27/124 257/72 |
| 2017/0133515 | A1* | 5/2017 | Li | H01L 29/42384 |
| 2017/0271374 | A1* | 9/2017 | Zhang | H01L 21/02565 |
| 2018/0023705 | A1* | 1/2018 | Watanabe | F16J 15/08 277/647 |
| 2018/0166562 | A1* | 6/2018 | Ning | H01L 29/66969 |

FOREIGN PATENT DOCUMENTS

| | | |
|---|---|---|
| CN | 102655116 A | 9/2012 |
| CN | 104659108 A | 5/2015 |
| CN | 106024809 A | 10/2016 |

\* cited by examiner

ARRAY SUBSTRATES, MANUFACTURING METHODS THEREOF, AND LIQUID CRYSTAL DISPLAY (LCD) PANELS

BACKGROUND

1. Technical Field

The present disclosure relates to display field, more particularly to an array substrate, a manufacturing method thereof, and a liquid crystal display (LCD) panel.

2. Description of Related Art

Improving quality and reducing costs are main factors of the display industry. With the evolution of the technology, the manufacturing processes of the display and the manufacturing quality of the display have been improved. As such, the size of the pixels may be manufactured in an even smaller size. However, the demand of people has changed, people currently pays more attention on the view angle and the color space instead of high brightness and high contrast.

The in-plane switching (IPS) is one of the greatest manufacturing methods among the display technology. However, the pixel manufacturing process of the convention IPS is complex and has at least four layers, including the first metal layer (M1), the active layer, the second metal layer (M2), the photovoltaic (PV) layer, and the pixel electrode, which result in high costs for massive production. If the manufacturing process may be simplified, the costs may be reduced.

SUMMARY

The present disclosure relates to an array substrate, a manufacturing method thereof, and a LCD panel. As such, the manufacturing process of the array substrate may only require two masks, the productivity may be improved, and the costs may be reduced.

In one aspect, the present disclosure relates to a manufacturing method of array substrates, including: forming a first metal layer on a substrate, etching the first metal layer via a first mask to form a gate and a common electrode; forming a gate insulation layer, an active layer, and a second metal layer on the first metal layer in sequence, etching the second metal layer and the active layer via a second mask to form a source, a drain, and a pixel electrode.

In another aspect, the present disclosure relates to an array substrate, including a first metal layer, a gate insulation layer, an active layer, and a second metal layer stacked in sequence; the first metal layer includes a gate and a common electrode, and the second metal layer includes a source, a drain, and a pixel electrode.

In another aspect, the present disclosure relates to a LCD panel, including: an array substrate, a color film substrate, and a liquid crystal layer configured between the array substrate and the color film substrate, wherein the array substrate is manufactured by the manufacturing method descried above.

In view of the above, the present disclosure relates to the manufacturing method of the array substrates, including: forming the first metal layer on the substrate, etching the first metal layer via the first mask to form the gate and the common electrode, forming the gate insulation layer, the active layer, and the second metal layer on the first metal layer in sequence, etching the second metal layer and the active layer via the second mask to form the source, the drain, and the pixel electrode. As such, the manufacturing process of the array substrate may only require two masks, the productivity may be improved, and the costs may be reduced.

DETAILED DESCRIPTION

Figure 1:
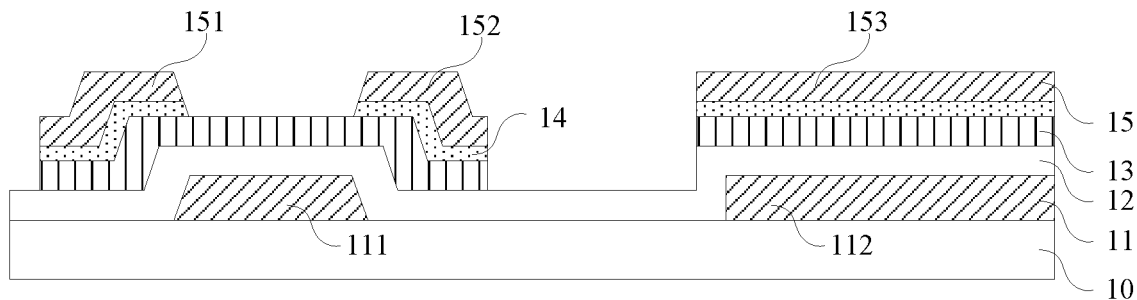
FIG. 1 is a schematic view of an array substrate in accordance with one embodiment of the present disclosure.
Figure 2:
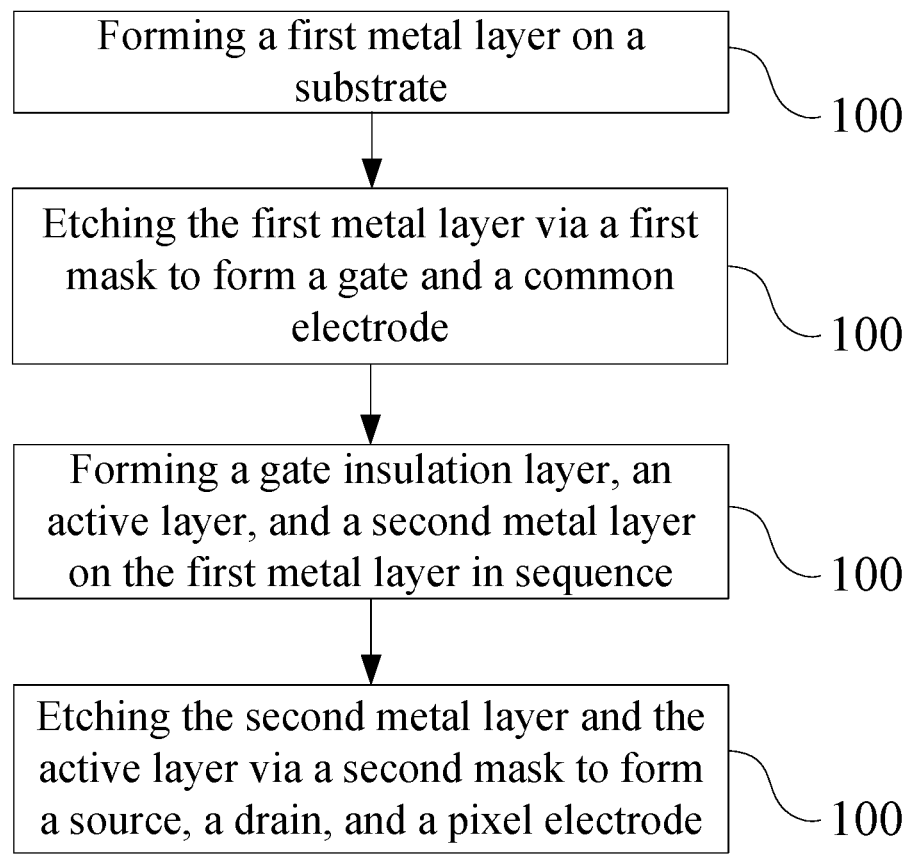
FIG. 2 is a flowchart of a manufacturing method of array substrates in accordance with one embodiment of the present disclosure.

Referring to FIG. 1, the present disclosure relates to an array substrate. The array substrate includes a first metal layer 11, a gate insulation layer 12, an active layer, and a second metal layer 15 stacked on a substrate 10 in sequence.

Wherein the active layer includes a semiconductor layer 13 and an ion injection layer 14.

The first metal layer 11 includes a gate 111 and a common electrode 112, and the second metal layer 15 includes a source 151, a drain 152, and a pixel electrode 153.

Specifically, an etching process is conducted on the first metal layer 11 via a first mask to form the gate 111 and the common electrode 112. The etching process is conducted on the second metal layer 15 via a second mask to form the source 151, the drain 152, and the pixel electrode 153.

The second metal layer 15 is made by antioxidant metal material, and the second metal layer 15 is exposed to a liquid crystal layer configured between the array substrate and a color film substrate.

Referring to FIG. 2 to FIG. 13, a manufacturing method of the array substrates may include the following steps.

In S21: forming the first metal layer on the substrate.

In S22: etching the first metal layer via the first mask to form the gate and the common electrode.

In one example, the substrate 10 may be a transparent glass substrate or a transparent plastic substrate. The first metal layer is made by one of or a combination of Pt, Ru, Au, Ag, Mo, Cr, Al, Ta, Ti, or W.

A physical vapor deposition (PVD) process or a chemical vapor deposition (CVD) process may be conducted to deposit a metal layer on the substrate 10. Specifically, one or more of physical sputtering, spin coating, inkjet, slit coating or lithography may be adopted, but is not limited in the present disclosure.

Figure 3:
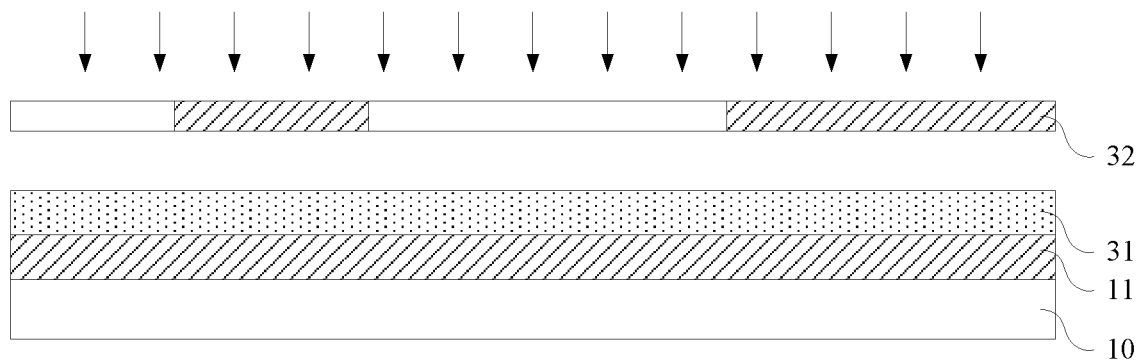
FIG. 3 to FIG. 6 are schematic views of the array substrate manufactured by step S21 to S22 of the manufacturing method.
Figure 4:
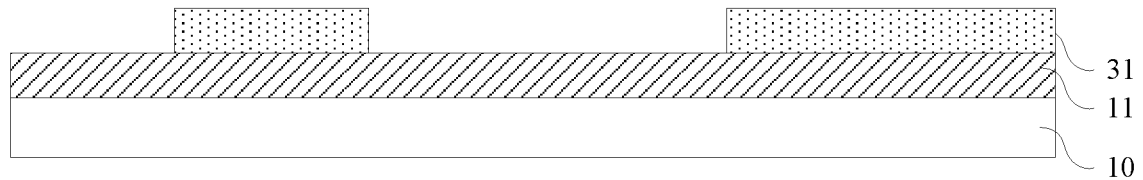
Figure 5:
Figure 6:

As shown in FIG. 3, after depositing the metal layer, photoresist glue is coated on the first metal layer 11, and an exposure and development process is conducted on the photoresist glue 31 via the first mask 32. As shown in FIG. 4, after conducting the exposure and development process on the photoresist glue, the etching process is conducted on the first metal layer to form a structure shown in FIG. 5. The photoresist glue 31 is peeled off to form the gate 111 and the common electrode 112.

It is noted that the gate 111 and the common electrode 112 are manufactured by the same metal layer, i.e. the first metal layer 11, and only one mask is used during a patterned process.

S23: forming the gate insulation layer, the active layer, and the second metal layer on the first metal layer in sequence.

Figure 7:
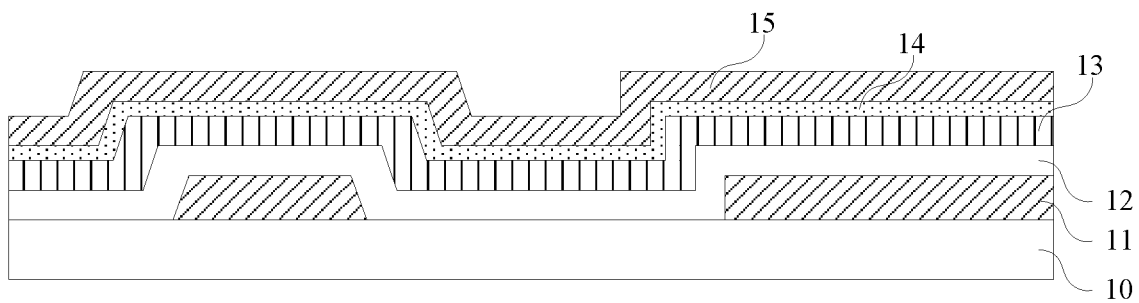
FIG. 7 illustrates a schematic view of the array substrate manufactured by step S23 of the manufacturing method.

Specifically, as shown in FIG. 7, the gate insulation layer 12 is configured on the first metal layer 11. The semiconductor layer 13 is configured on the gate insulation layer 12. An ion injection process is conducted on the semiconductor layer to form the ion injection layer 13. The second metal layer 15 is configured on the ion injection layer 15.

In one example, the gate insulation layer 12 may be SiOx, SiNx, or a mixture of SiOx and SiNx. The semiconductor layer 13 may be manufactured by Si, Ga, or GaAs. Specifically, the semiconductor layer may be manufactured by As. The ion injection layer is also referred to as an ion doping layer. Ions may be injected in different manner according to functions of thin film transistors (TFTs). Phosphorus may be injected when forming a N-type semiconductor. Boron or gallium may be injected when forming a P-type semiconductor.

When a liquid crystal box is formed by the array substrate and the color film substrate opposite to the array substrate, the second metal layer 15 is directly exposed and contact with liquid crystal. So that, the second metal layer 15 has to adopt metal difficult to oxidize, such as Ag or a multi-layer structure form by Ag and Mo.

S24: etching the second metal layer and the active layer via the second mask to form the source, the drain, and the pixel electrode.

Figure 8:
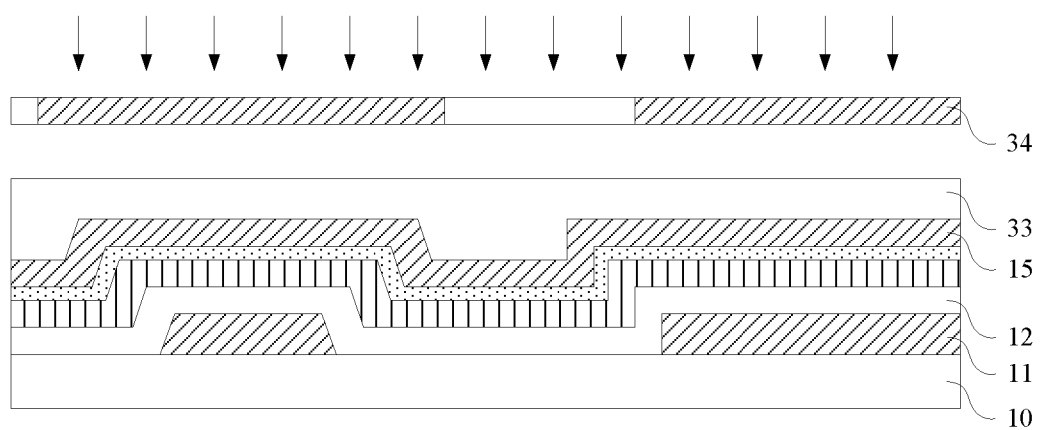
FIG. 8 to FIG. 13 are schematic views of the array substrate manufactured by step S24 of the manufacturing method.
Figure 9:
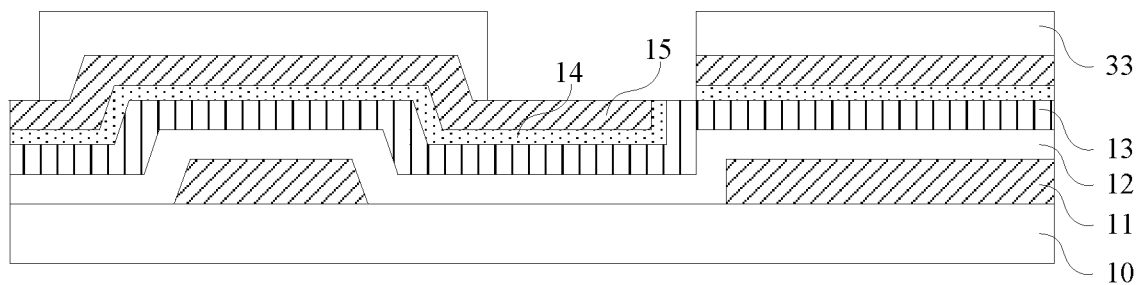

Specifically, as shown in FIG. 8, the photoresist glue 33 is coated on the second metal layer 15, and the exposure and development process is conducted on the photoresist glue 33 via the second mask 34. FIG. 9 is a schematic view illustrating a structure of the photoresist glue 33 after conducting the exposure and development process.

The etching process is conducted on the second metal layer 15, the semiconductor layer 13, and the ion injection layer 14 to form the source, the drain, and the pixel electrode.

Figure 10:
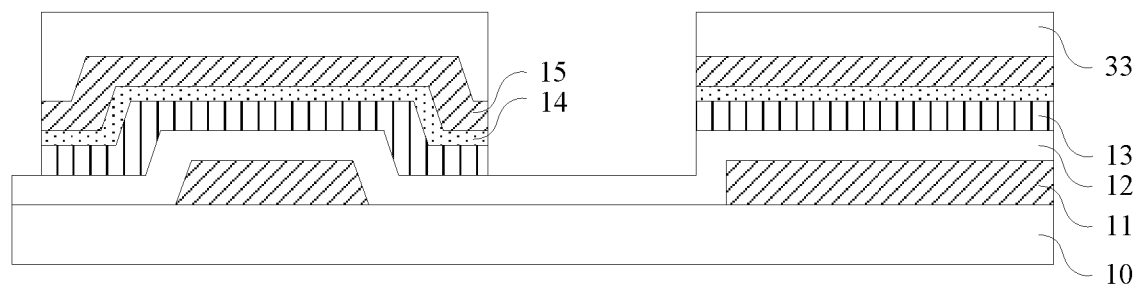

Specifically, as shown in FIG. 10, the etching process is conducted on the second metal layer 15, the semiconductor layer 13, and the ion injection layer 15 to expose the gate insulation layer 12 within an area, wherein the area is not covered by the photoresist glue. In one example, a wet-etch process may be conducted on the second metal layer 15, and a dry-etch process may be conducted on the ion injection layer 13 and the semiconductor layer 14.

Figure 11:
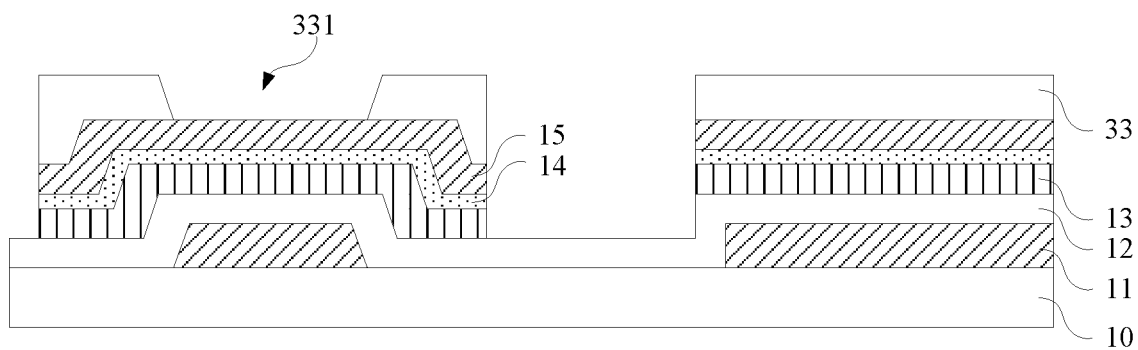
Figure 12:
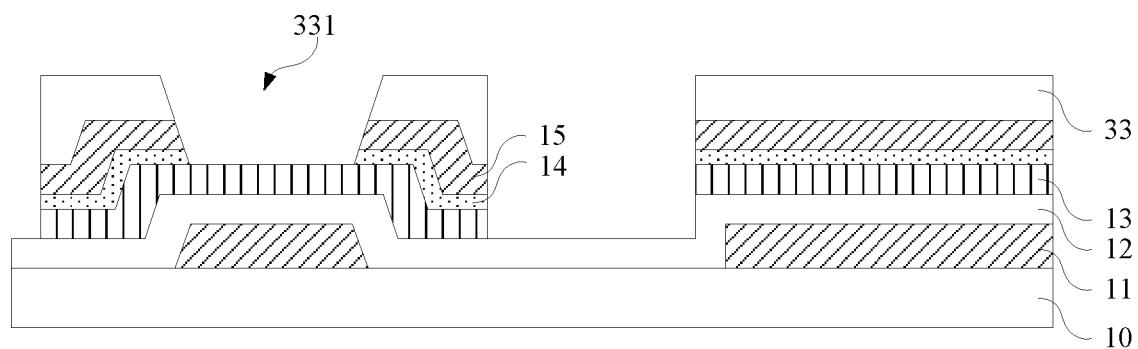

As shown in FIG. 11, a hole is dig on the photoresist glue to form a through hole 331 in order to expose a portion of the second metal layer 15, and the portion of the second metal layer 15 is covered by the photoresist glue 33. Wherein the exposed portion of the second metal layer 15 corresponds to the gate 111. As shown in FIG. 12, the etching process is conducted on the exposed second metal layer 15 to expose the ion injection layer 14, and the etching process is conducted on the exposed ion injection layer 14 to expose the semiconductor layer 13.

Figure 13:
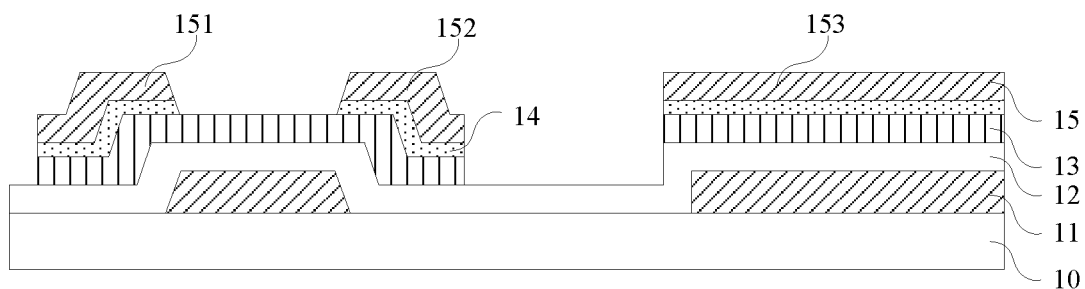

As shown in FIG. 13, the photoresist glue on the second metal layer 15 is peeled off to form the array substrate.

Wherein the source 151, the drain 152, and the pixel electrode 153 are formed on the second metal layer 15 by during the etching process.

It is noted that the source 151, the drain 152, and the pixel electrode 153 are manufactured by the same metal layer, i.e. the second metal layer 15, and only one mask is used during a patterned process.

Figure 14:
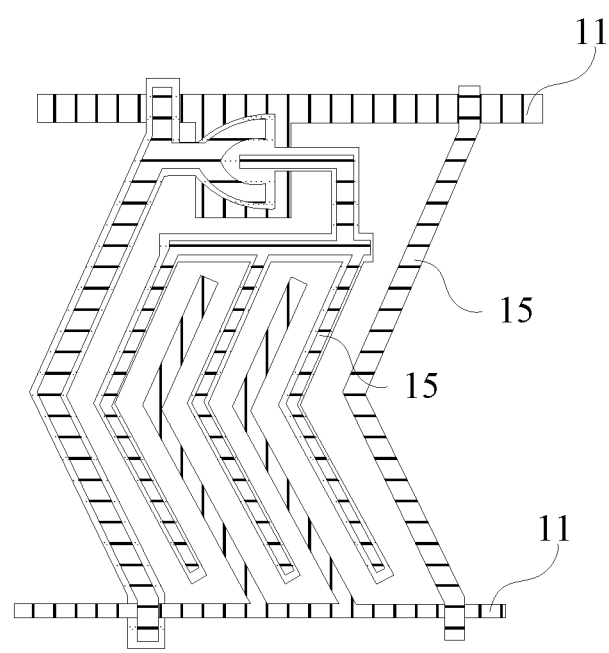
FIG. 14 is a top view of an array substrate manufactured by the manufacturing method in accordance with one embodiment of the present disclosure.

As shown in FIG. 14, an area illustrated with vertical lines indicates a pattern of the first metal layer 11, and an area illustrated with horizontal line indicates a pattern of the second metal layer 15.

In view of the above, the present disclosure relates to the manufacturing method of the array substrates, including: forming the first metal layer on the substrate, etching the first metal layer via the first mask to form the gate and the common electrode, forming the gate insulation layer, the active layer, and the second metal layer on the first metal layer in sequence, etching the second metal layer and the active layer via the second mask to form the source, the drain, and the pixel electrode. As such, the manufacturing process of the array substrate may only require two masks, the productivity may be improved, and the costs may be reduced.

Figure 15:
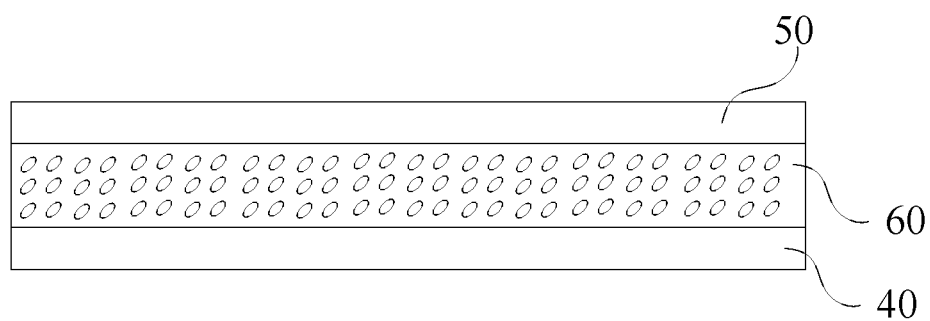
FIG. 15 is a schematic view of a LCD in accordance with one embodiment of the present disclosure.

As shown in FIG. 15, the present disclosure relates to a LCD, including: the array substrate 40, the color film substrate 50, and the liquid crystal layer 60 configured between the array substrate 40 and the color film substrate 50.

The array substrate 40 is manufactured by the above manufacturing method. The second metal layer, which includes the source, the drain, and the pixel electrode, is exposed to the liquid crystal layer 60, So that, the second metal layer has to adopt metal difficult to oxidize, such as Ag or a multi-layer structure form by Ag and Mo.

The photoresist glue may be configured on the color film substrate. In one example, the photoresist glue may include a RGB photoresist glue.

In one example, the LCD may be an in-plane switching (IPS) type LCD, including a LCD panel and a backlight. Wherein the structure of the LCD panel is the same with the structure described in above, and may not be described again.

In view of the above, the present disclosure relates to the LCD. The etching process is conducted on the first metal layer via the first mask to form the gate and the common electrode. The etching process is conducted on the second metal layer via the second mask to form the source, the drain, and the pixel electrode. As such, the manufacturing process of the array substrate may only require two masks, the productivity may be improved, and the costs may be reduced.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A manufacturing method of array substrates, comprising:
    forming a first metal layer on a substrate;
    etching the first metal layer via a first mask to form a gate and a common electrode;
    forming a gate insulation layer, an active layer, and a
        second metal layer on the first metal layer in sequence;

etching the second metal layer and the active layer via a second mask to form a source, a drain, and a pixel electrode;

wherein the second metal layer is etched to form the source, the drain, and the pixel electrode which are spaced from each other, the source, the drain, and the pixel electrode are made by antioxidant metal material and exposed to a liquid crystal layer configured between the array substrate and the color film substrate.

2. The manufacturing method according to claim 1, wherein step of etching the first metal layer further comprises:

coating photoresist glue on the first metal layer;

conducting an exposure and development process on the photoresist glue via the first mask;

etching the first metal layer to form the gate and the common electrode.

3. The manufacturing method according to claim 1, wherein step of forming a gate insulation layer, an active layer, and a second metal layer on the first metal layer in sequence further comprises:

forming a gate insulation layer on the first metal layer;

forming a semiconductor layer on the gate insulation layer, and conducting an ion injection process on a surface of the semiconductor layer to form an ion injection layer;

forming the second metal layer on the ion injection layer.

4. The manufacturing method according to claim 3, wherein the step of etching the second metal layer and the active layer further comprise:

coating the photoresist glue on the second metal layer;

conducting the exposure and development process on the photoresist glue via the second mask;

etching the second metal layer, the semiconductor layer, and the ion injection layer to form the source, the drain, and the pixel electrode.

5. The manufacturing method according to claim 4, wherein the photoresist glue covers the corresponding gate after conducting the exposure and development process;

the step of etching the second metal layer, the semiconductor layer, and the ion injection layer further comprises:

etching the second metal layer, the semiconductor layer, and the ion injection layer to expose the gate insulation layer within an area such that the gate insulation corresponding to the area is non-covered by another structure of the array substrates, wherein the area is not covered by the photoresist glue;

digging a hole on the photoresist glue to expose a portion of the second metal layer, wherein the portion of the second metal layer is covered by the photoresist glue;

etching the exposed second metal layer to expose the ion injection layer;

etching the exposed ion injection layer to expose the semiconductor layer.

6. The manufacturing method according to claim 5, wherein the step of etching the second metal layer, the semiconductor layer, and the ion injection layer further comprises:

conducting a wet etching process on the second metal layer to expose the ion injection layer;

conducting a dry etching process on the ion injection layer and the semiconductor layer to expose the gate insulation layer.

* * * * *